United States Patent
Chou et al.

(10) Patent No.: US 9,625,186 B2
(45) Date of Patent: Apr. 18, 2017

(54) COOLING SYSTEM FOR 3D IC

(71) Applicant: Taiwan Semiconductor Manufacturing Co., Ltd., Hsin-Chu (TW)

(72) Inventors: Chung-Cheng Chou, Hsin-Chu (TW); Po-Hao Lee, Hsinchu (TW); Jonathan Tehan Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 598 days.

(21) Appl. No.: 14/013,125

(22) Filed: Aug. 29, 2013

(65) Prior Publication Data

US 2015/0059362 A1 Mar. 5, 2015

(51) Int. Cl.
F25B 21/02 (2006.01)
H01L 23/38 (2006.01)

(52) U.S. Cl.
CPC .............. F25B 21/02 (2013.01); H01L 23/38 (2013.01); *F25B 2321/0212* (2013.01); *H01L 2924/0002* (2013.01)

(58) Field of Classification Search
CPC .......... F25B 21/00; H01L 23/34; H01L 23/38; H01L 23/48; H01L 23/2677; H01L 35/00; H01L 35/04
See application file for complete search history.

(56) References Cited

U.S. PATENT DOCUMENTS

| 7,352,063 | B2 * | 4/2008 | Noguchi | H01L 21/56 257/707 |
| 8,513,795 | B2 | 8/2013 | Yang et al. | |
| 2006/0137732 | A1 | 6/2006 | Farahani et al. | |
| 2009/0312887 | A1 * | 12/2009 | Barry | H01L 23/3121 700/300 |
| 2010/0257871 | A1 * | 10/2010 | Venkatasubramanian | H01L 23/38 62/3.7 |
| 2011/0042805 | A1 * | 2/2011 | Yu | H01L 35/32 257/737 |
| 2012/0153454 | A1 * | 6/2012 | Liu | H01L 23/38 257/712 |
| 2013/0120021 | A1 | 5/2013 | Chi | |

FOREIGN PATENT DOCUMENTS

CN 101091246 A 12/2007
CN 103236420 A 8/2013

OTHER PUBLICATIONS

Wong, S. et al., "Monolithic 3D Integrated Circuits", Published in International Symposium on VLSI Technology, Systems and Applications, Apr. 2007, VLSI-TSA 2007, 4 pages.

(Continued)

*Primary Examiner* — Elizabeth Martin
(74) *Attorney, Agent, or Firm* — Duane Morris LLP

(57) ABSTRACT

A system and method of cooling a three dimensional integrated circuit (3D IC) using at least one thermoelectric cooler which is connected to the 3D IC by a plurality of conductive pillars. In some embodiments a controller controls power supply to the thermoelectric cooler, and a temperature monitor provides a temperature input to the controller. In some embodiments the controller maintains a temperature of a 3D IC within a predetermined range by cycling power to the thermoelectric cooler.

21 Claims, 13 Drawing Sheets

(56) References Cited

OTHER PUBLICATIONS

Jia, S. et al., "A 3D Micro-channel Cooling System Embedded in LTCC Packaging Substrate", Published in 2012 7th IEEE International Conference on Nano/Micro Engineered and Molecular Systems (NEMS), Mar. 2012, pp. 649-652.
Liu, C. et al., "A Design Tradeoff Study with Monolithic 3D Integration", Published in 2012 13th International Symposium on Quality Electronic Design (ISQED), Mar. 2012, pp. 529-536.
Official Action issued Sep. 26, 2016 in counterpart Chinese patent application No. 2016092101782920.

* cited by examiner

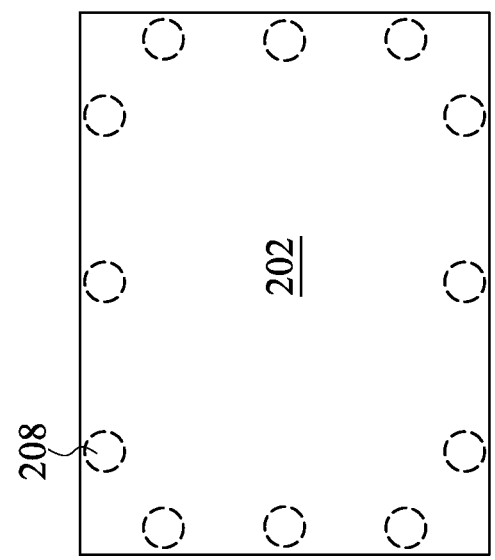
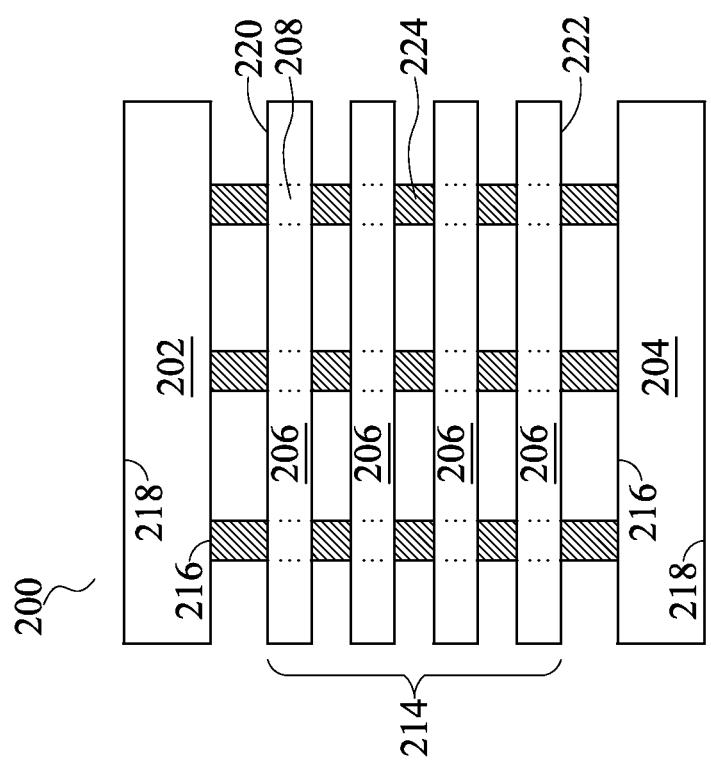

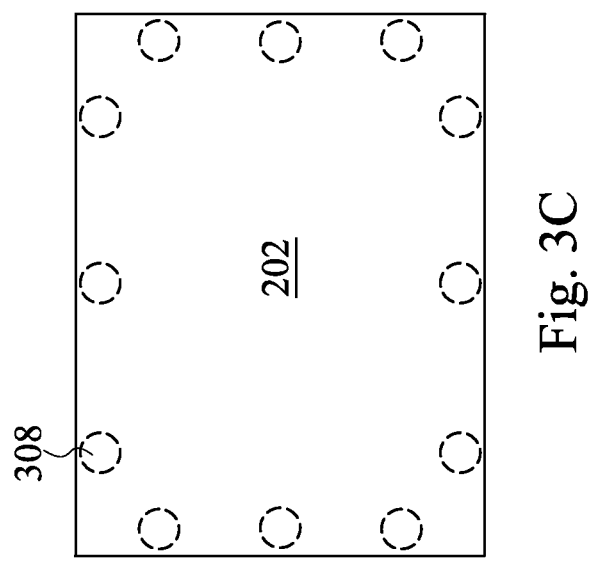

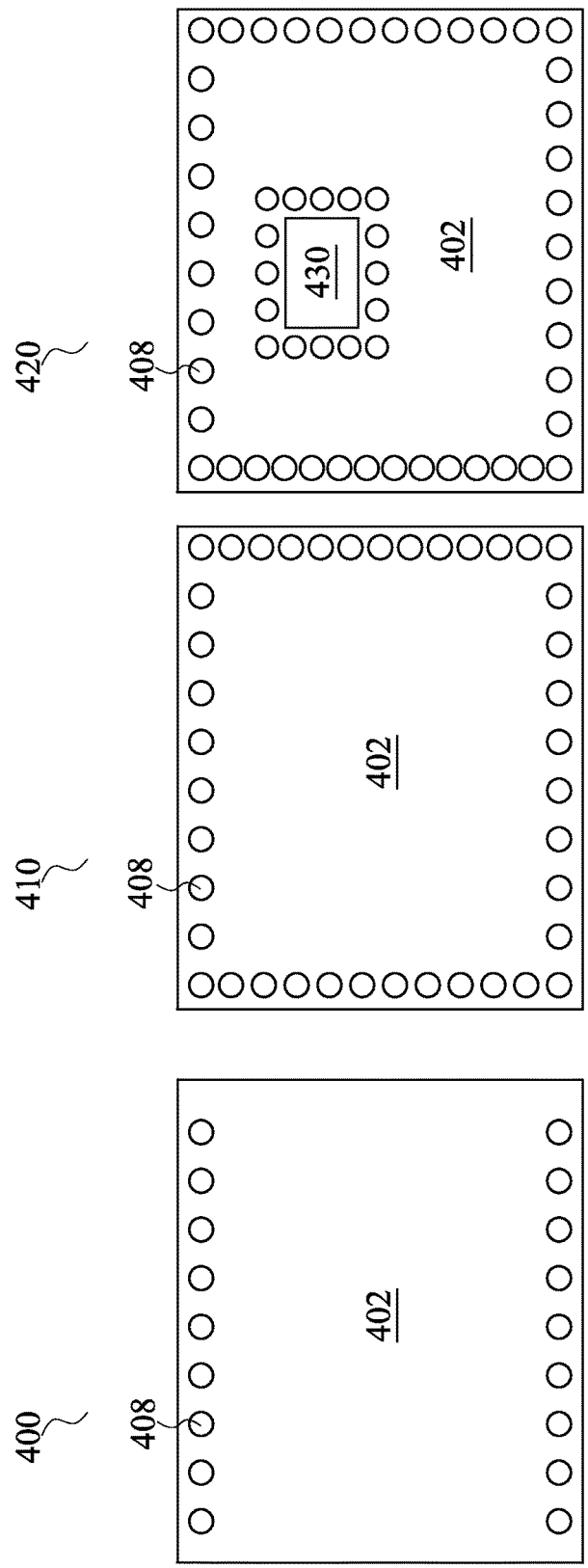

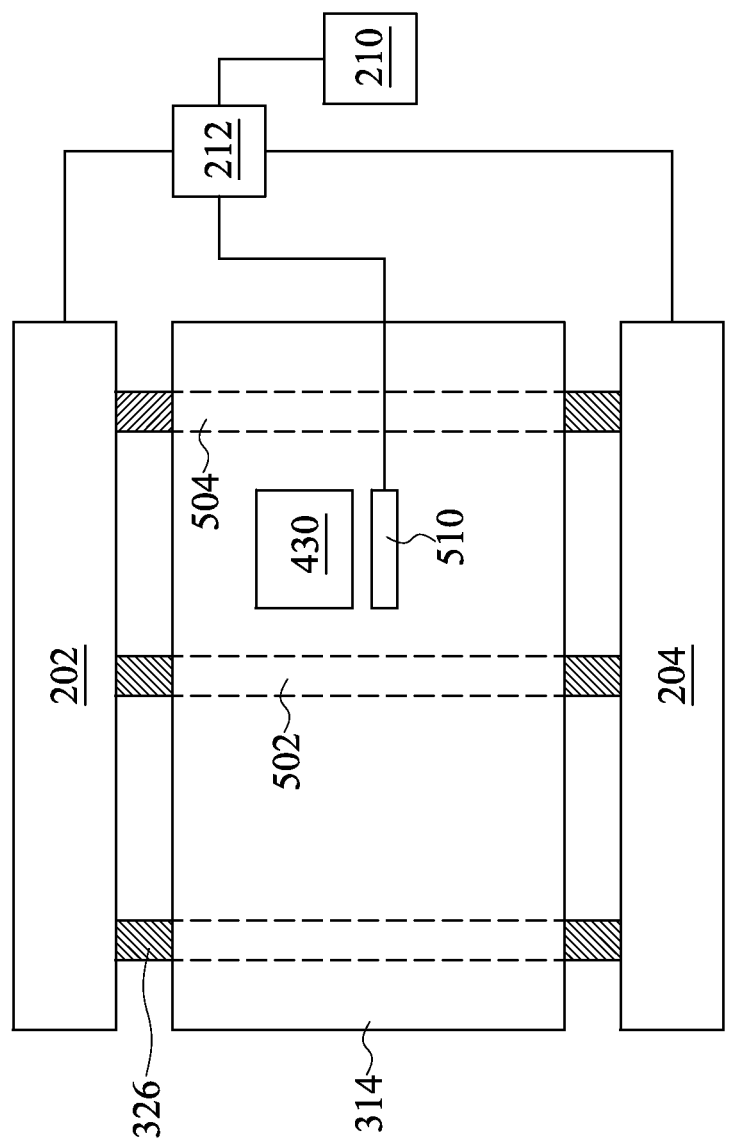

COOLING SYSTEM FOR 3D IC

FIELD

This disclosure relates to three dimensional integrated circuit (3D IC) generally, and more specifically to a cooling system for 3D IC.

BACKGROUND

Three dimensional integrated circuits (3D IC) offer a host of advantages over traditional circuits: lower power consumption, higher logic density, greater efficiency, alleviating bottlenecks, shorter critical path delays, and lower area cost to name just a few.

3D ICs come in two general forms. In a first configuration, 3D IC chip packages contain two or more integrated circuit dies (ICs) stacked vertically so that they occupy less space. Power and signal communication connections between the vertically stacked ICs can be made using through-semiconductor-vias (TSV), also referred to as through-silicon-vias or through-substrate-vias, which pass through the entire thickness of a die, permitting connections between conductive patterns on the front face and back face of the die.

In a second configuration, a stacked cell 3D IC has a plurality of stacked cells (also referred to as tiers). This configuration is sometimes referred to as monolithic 3D IC or 3D IC vertical structure. In a stacked cell 3D IC, stack components or cells are formed in a verticalabove a single semiconductor substrate (as opposed to fabricating individual chips and joining the individual chips together). Components that are traditionally arranged horizontally can be stacked on top of each other to reduce area cost. A stacked cell 3D IC can provide a dense system of vertical interconnectivity by inter-level vias (ILV), also referred to as inter-tier vias, which carry power and communications between the stacked cells.

3D IC packages present many new challenges for designers. One such challenge is heat dissipation. For 3D IC chip packages, if three or more dies are included in the stack, then the interior dies—all of the dies except for the topmost die and bottommost die—are sandwiched between other dies without access to ambient cooling. The same is true for 3D IC stacked cells—all cells except the topmost and bottommost cells lack access to ambient cooling. Effective heat dissipation in the interior dies and interior cells is essential to preventing premature failure of these components.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout specification and drawing.

FIG. 2B is a side cross-sectional view of a cooled 3D IC in accordance with some embodiments of the present disclosure.

FIG. 2C is a top plan view of a cooled 3D IC in accordance with some embodiments of the present disclosure.

FIG. 3C is a top plan view of a cooled 3D IC in accordance with some embodiments of the present disclosure.

FIG. 4A is a plan view of a conductive pillar in accordance with some embodiments of the present disclosure.

FIG. 4B is a plan view of a conductive pillar configuration in accordance with some embodiments of the present disclosure.

FIG. 4C is a plan view of a conductive pillar configuration in accordance with some embodiments of the present disclosure.

FIG. 5A is a simplified block diagram of a cooled 3D IC with temperature monitor and controller in accordance with some embodiments of the present disclosure.

DETAILED DESCRIPTION

Figure 1:
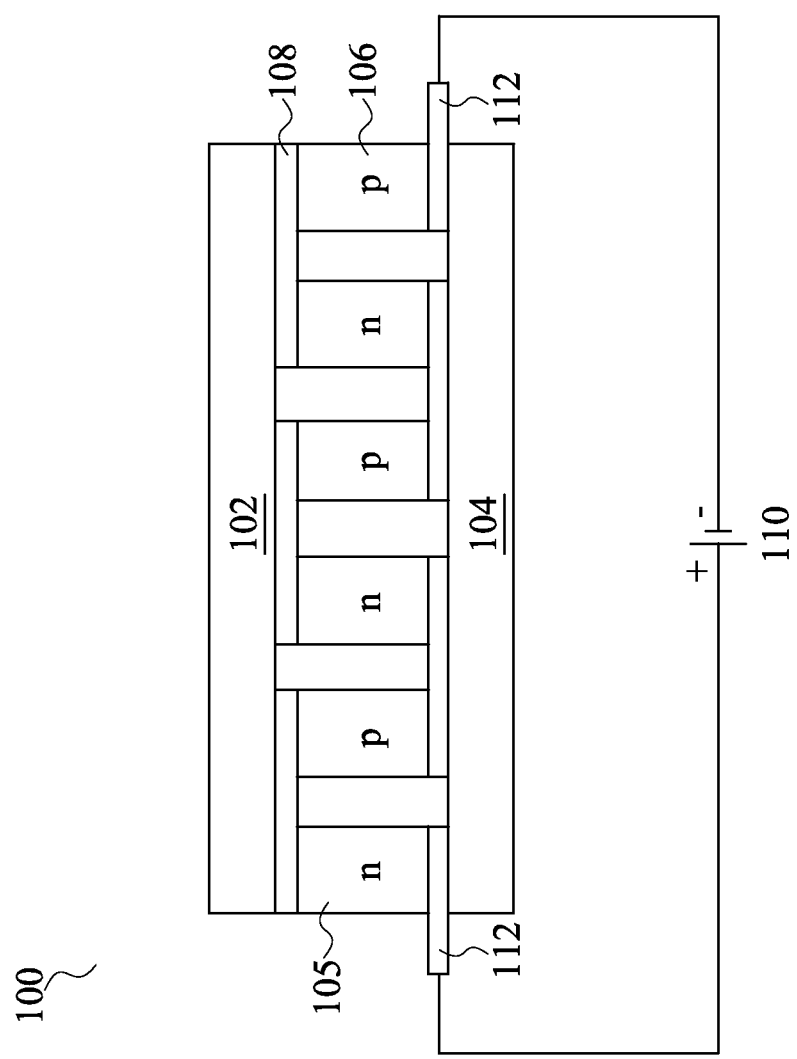
FIG. 1 is a simplified block diagram of a thermoelectric cooler in accordance with some embodiments of the present disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In traditional (non-3D IC) semiconductor packages, a heat sink typically comprises a metal structure with a first surface in thermal contact with the semiconductor components to be cooled. A second surface of the metal structure typically includes a series offins, protrusions, or comb-like structures to increase the metal structure's surface area, thus increasing the rate of heat transfer from the metal structure to the surrounding atmosphere. In some typical embodiments, a fan is employed to provide increased airflow over the metal structure, further improving the rate of heat transfer from the metal structure to the surrounding atmosphere.

Although these traditional means of cooling semiconductors have been applied to 3D ICs, they have drawbacks because it is not practical to provide a large heat spreader on the interior dies or interior cells. Some 3D ICs rely on a thick silicon layer at the top and bottom of a 3D IC to spread and dissipate heat; these thick layers reduce the area savings of 3D IC. This method of cooling is passive—heat passively flows out of the interior dies to the heat spreaders, which can lead to unacceptably high temperatures in the interior of the 3D IC.

Another method currently employed in the art for cooling the a 3D IC package is to create microchannels between dies or cells and provide fluid flow through the microchannels to carry heat away. However, this method is problematic because it requires a pump to provide fluid flow, creates potential for fluid leakage into the 3D IC, and causes thermal stress on semiconductor substrates.

The present disclosure provides a thermoelectric cooler for actively cooling a 3D IC. A first embodiment employs a thermoelectric cooler to cool a 3D IC chip package. A second embodiment employs a thermoelectric cooler to cool a stacked cell 3D IC. The thermoelectric coolers create a temperature difference which helps to actively remove heat from a 3D IC. A method of cooling a 3D IC is provided, comprising monitoring a temperature of the 3D IC at a predetermined interval and energizing a thermoelectric cooler, the thermoelectric cooler connected to the 3D IC via a plurality of conductive pillars, at the first predetermined interval when the temperature of the 3D IC is greater than or equal to a first predetermined setpoint.

FIG. 1 is a simplified block diagram of a thermoelectric cooler 100 in accordance with some embodiments of the present disclosure. A thermoelectric cooler 100 is also known in the art as a Peltier cooler. A thermoelectric cooler 100 is a solid-state active heat pump. The term 'thermoelectric cooler' is sometimes abbreviated in the art as 'TEC'.

A plurality of first regions 105 and a plurality of second regions 106 are disposed between a first conducting plate 102 and a second conducting plate 104. In some embodiments, first regions 105 are n-type semiconductor pellets and second regions 106 are p-type semiconductor pellets. Additional materials and design shapes can be used to construct the plurality of first regions 105 and the plurality of second regions 106. In some embodiments, first conducting plate 102 and second conducting plate 104 are made of ceramic, which is an effective heat conductor and an electrical insulator (for example, beryllia, BeO). Additional materials can be used to construct first conducting plate 102 and second conducting plate 104.

The plurality of semiconductor pellets 105, 106 are electrically connected in series using traces 108. In some embodiments, traces 108 comprise copper. In other embodiments, traces 108 comprise another electrically conductive material.

A power source 110 provides electrical power to a pair of electrical connections 112. When voltage is applied across the plurality of semiconductor pellets 105, 106, a temperature gradient is formed such that first conducting plate 102 is cooled and second conducting plate 104 is heated.

In some embodiments, second conducting plate 104 includes a series of fins, protrusions, or comb-like structures to increase the surface area of second conducting plate 104, thus increasing the rate of heat transfer from second conducting plate 104 to the surrounding atmosphere. In some embodiments, a fan is employed to provide increased air-flow over second conducting plate 104, further improving the rate of convection heat transfer from second conducting plate 104 to the surrounding atmosphere.

Figure 2A:
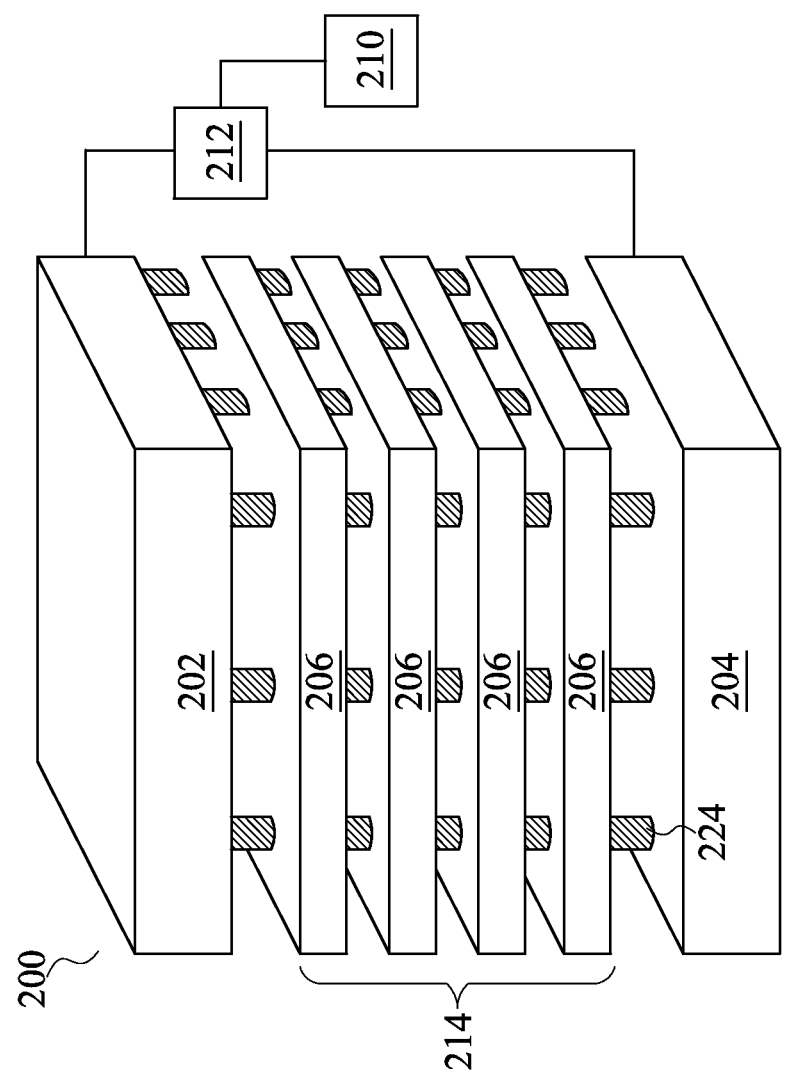
FIG. 2A is an isometric view of a cooled 3D IC in accordance with some embodiments of the present disclosure.

FIGS. 2A, 2B, and 2C illustrate a cooled 3D IC 200 in accordance with some embodiments of the present disclosure. FIG. 2A is an isometric view of the cooled 3D IC; FIG. 2B is a side elevation view of the cooled 3D IC; and FIG. 2C is a top plan view of the cooled 3D IC.

The cooled 3D IC 200 comprises a first thermoelectric cooler 202, a second thermoelectric cooler 204, and a 3D IC chip package 214 containing a plurality of dies 206. The plurality of dies 206 have a plurality of through-silicon-vias (TSVs) 208 extending from a front face of the die to the back face of the die. Solder microbumps 208 form vertical interconnections between corresponding TSVs in vertically adjacent dies 206. In some embodiments, only a single thermoelectric cooler is utilized and either first thermoelectric cooler 202 or second thermoelectric cooler 204 is omitted.

The plurality of TSVs 208 serve several functions in cooled 3D IC 200, including delivering power and communication signals to the various components on the plurality of dies 206 and serving as a conduit for dissipating heat formed during component operation. Each TSV 208 is formed from a metal or alloy that can be integrated into silicon such as copper, tungsten, silver, aluminum, or alloys thereof. In some embodiments, each TSV 208 is formed as a column with rounded edges. In other embodiments, each TSV 208 is formed as a cuboid or hexahedron with straight edges meeting a right angles. In some embodiments, additional shapes and configurations of TSVs 208 are employed.

As best seen in FIG. 2B, each of the plurality of TSVs 208 pass through a respective one of the plurality of dies 206. The TSVs 208 in each die 206 are aligned, in-line with the TSVs 208 in each adjacent die 206 above or below that die 206. Microbumps 224 are formed on the surface of each TSV 208 on the back side of the substrate. Each pair of aligned TSVs 208 in adjacent dies 206 are electrically connected by a respective microbump 224. In some embodiments, an underfill material (not shown) fills the remaining space between each pair of adjacent dies 206, including the spaces between TSVs 208. The underfill provides horizontal and vertical heat conduction paths.

In some embodiments, a plurality of microbumps 224 are formed on the top surface of the TSVs 208 or on the bottom of the first thermoelectric cooler 202 to connect the 3D IC chip package 214 to the first thermoelectric cooler 202. Similarly, microbumps 224 between the back surface of each TSV 208 and the and the second thermoelectric cooler 204 provide a conductive path to conduct heat from the 3D IC chip package 214 to the second thermoelectric cooler 204. An underfill material (not shown) can be provided to fill the spaces between microbumps 224, improving thermal conduction and mechanical integrity. Alternatively, a conductive thermal interface material (e.g., beryllium oxide, aluminum nitride, aluminum oxide, zinc oxide, or metal-based thermal grease) is applied between the top surface 220 of the top die 206 and the first thermoelectric cooler 202. Similarly, thermal interface material between the bottom surface 222 of the bottom TSV 208 and the second thermoelectric cooler 204 provides a conductive path to conduct heat from the 3D IC chip package 214 to the second thermoelectric cooler 204.

First thermoelectric cooler 202 and second thermoelectric cooler 204 are constructed as described above with respect to FIG. 1. First thermoelectric cooler 202 and second thermoelectric cooler 204 each have a cool side 216 and a hot side 218, and are disposed such that cool side 216 is facing the 3D IC chip package 214.

In some embodiments, cool side 216 is disposed in contact with the top surface 220 of the topmost of the plurality of dies 206, such that cooling is provided along the entirety of top surface 220. In other embodiments, cool side 216 is disposed above but not in contact with top surface 220, such that cooling is provided via the TSVs 208 and microbumps 224 which connect cool side 216 and the plurality of dies 206. In some embodiments, an underfill material fills the spaces between TSVs 208 and provides an additional path for conducting heat. Cool side 216 of second thermoelectric cooler 204 can also be disposed in contact with or below bottom surface 222 of the bottommost of the plurality of dies 206. Microbumps 224, thermal interface material and/or underfill provide a path to conduct heat to the thermoelectric cooler 204.

First thermoelectric cooler 202 and second thermoelectric cooler 204 are each connected to power supply 210. In some embodiments, power supply 210 is connected to first thermoelectric cooler 202 and second thermoelectric cooler 204 via a controller 212.

As best seen in FIG. 2C, in some embodiments the plurality of TSVs 208 are arranged around the perimeter of the 3D IC chip package 214 and thermoelectric coolers 202 and 204. In the illustrated embodiment, the plurality of TSVs 208 are evenly spaced about the perimeter. However, as discussed in more detail below, the plurality of TSVs 208 can be spaced in many configurations along the perimeter and/or through the center of the 3D IC chip package 214 to address specific cooling concerns.

When electrical power is supplied from power supply 210 to first thermoelectric cooler 202 and second thermoelectric cooler 204, a temperature gradient forms between cool side 216 and hot side 218. A second heat gradient forms between cool side 216 and the plurality of dies 206, which generate heat when operating. This second heat gradient has the effect of removing heat from the 3D IC chip package 214. Heat generated in the plurality of dies 206 flows horizontally to the plurality of TSVs 208 and then vertically through the plurality of TSVs 208 to the cool side 216 of both first thermoelectric cooler 202 and second thermoelectric cooler 204. The heat is then transferred from cool side 216 to hot side 218, which dissipates the heat to the ambient environment.

In some embodiments, hot side 218 includes a series of fins, protrusions, or comb-like structures to increase the surface area of hot side 218, thus increasing the rate of heat transfer from hot side 218 to the surrounding atmosphere. In some embodiments, a fan is employed to provide increased airflow over hot side 218, further improving the rate of convection heat transfer from hot side 218 to the surrounding atmosphere.

Figure 3A:
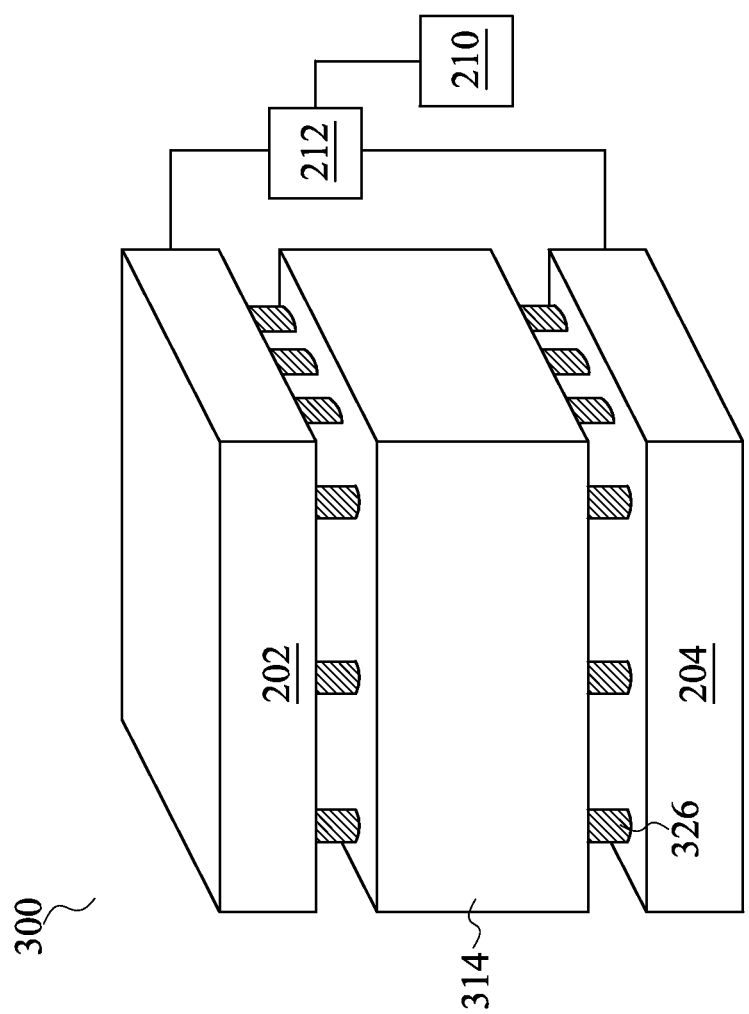
FIG. 3A is an isometric view of a cooled 3D IC in accordance with some embodiments of the present disclosure.
Figure 3B:
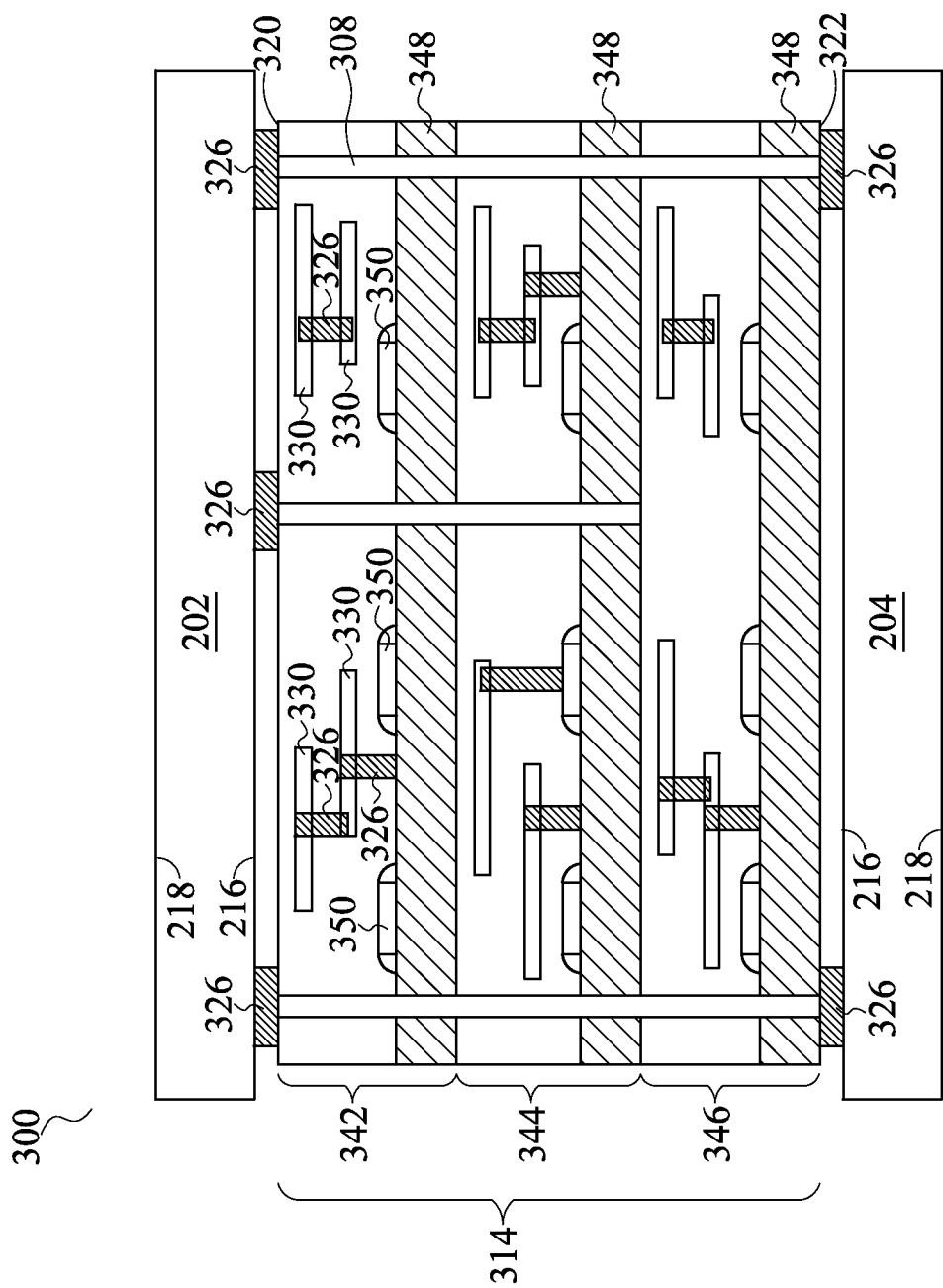
FIG. 3B is a side cross sectional view of a cooled 3D IC in accordance with some embodiments of the present disclosure.

FIGS. 3A, 3B, and 3C illustrate another cooled 3D IC 300 in accordance with some embodiments of the present disclosure. FIG. 3A is an isometric view of the 3D IC 300; FIG. 3B is a side cross sectional view of the 3D IC 300; and FIG. 3C is a top plan view of the 3D IC 300.

The cooled 3D IC 300 comprises a first thermoelectric cooler 202, a second thermoelectric cooler 204, and a stacked cell 3D IC 314. A plurality of inter-layer vias (ILVs) 308 run through the stacked cell 3D IC 314. Each ILV 308 is connected to first thermoelectric cooler 202 and second thermoelectric cooler 204 by a local via 326. In some embodiments, a local via 326 which connects an ILV 308 to a thermoelectric cooler is a microbump. In some embodiments, an ILV 308 is connected only to one of thermoelectric cooler 202 and second thermoelectric cooler 204. In some embodiments, a single thermoelectric cooler is utilized and either first thermoelectric cooler 202 or second thermoelectric cooler 204 is omitted.

The plurality of ILVs 308 serve several functions in cooled 3D IC 300, including delivering power and signals to the various components 330 and devices 350 within stacked cell 3D IC 314 and serving as a conduit for dissipating heat formed during operation of the various components 330 and devices 350. In some embodiments, each ILV 308 is formed as a column with rounded edges. In other embodiments, each ILV 308 is formed as a cuboid or hexahedron with straight edges meeting a right angles. In some embodiments additional shapes and configurations of ILVs 308 are employed.

As best seen in FIG. 3B, each of the plurality of ILVs 308 pass through at least one level (tier) of the stacked cell 3D IC 314. A conductive path through a stacked cell 3D IC 314 can include a combination of ILVs 308, local vias 326, and/or conductive lines (not shown). If the stacked cell 3D IC 314 has more than two tiers the conductive path can include a respective sequence of ILVs 308, local vias 326, and conductive lines for each respective tier of the stacked cell 3D IC 314.

In some embodiments, a plurality of local vias 326 are formed on the top surface 320 of the ILV 308 of the top tier of the stacked cell 3D IC 314. In some embodiments, a multi-layer interconnect structure (including plural local via layers and plural conductive line layers) is formed on the top surface of the ILV 308 of the top tier of the stacked cell 3D IC 314. The local vias 326 connect the stacked cell 3D IC 314 to the first thermoelectric cooler 202 and the second thermoelectric cooler 204. In some embodiments, the stacked cell 3D IC 314 is connected to the first thermoelectric cooler 202 and the second thermoelectric cooler 204 by microbumps.

The stacked cell 3D IC 314 of FIG. 3B comprises a first tier 342, a second tier 344, and a third tier 346. Each tier includes a substrate 348. Each tier can include a plurality of components 330 and devices 350. Components 330 and devices 350 can be connected to an ILV 308, local via 326, and/or conductive line (not shown). Components 330 can be but are not limited to transistors, diodes, resistors and the like. Devices can be but are not limited to sensors, imagers, nano devices, memory chips and circuits, processors, converters, and the like.

First thermoelectric cooler 202 and second thermoelectric cooler 204 are constructed as described above with respect to FIG. 1. First thermoelectric cooler 202 and second thermoelectric cooler 204 each have a cool side 216 and a hot side 218, and are disposed such that cool side 216 is facing the stacked cell 3D IC 314.

In some embodiments, cool side 216 of first thermoelectric cooler 202 is disposed in contact with the top surface 320 of stacked cell 3D IC 314, such that cooling is provided along the entirety of top surface 320. In other embodiments, cool side 216 is disposed above but not in contact with top surface 320, such that cooling is provided via the local vias 326 which connect cool side 216 and stacked cell 3D IC 314. Cool side 216 of second thermoelectric cooler 204 can also be disposed in contact with or below bottom surface 322 of stacked cell 3D IC 314.

First thermoelectric cooler 202 and second thermoelectric cooler 204 are each connected to power supply 210. In some embodiments, power supply 210 is connected to first thermoelectric cooler 202 and second thermoelectric cooler 204 via a controller 212.

As best seen in FIG. 3C, in some embodiments the plurality of ILVs 308 are arranged around the perimeter of the stacked cell 3D IC 314 and thermoelectric coolers 202 and 204. In the illustrated embodiment, the plurality of ILVs 308 or local vias 326 are evenly spaced about the perimeter. However, as discussed in more detail below, the plurality of ILVs 308 or local vias 326 can be spaced in many configurations along the perimeter and/or through the center of the stacked cell 3D IC 314 to address specific cooling concerns.

When electrical power is supplied from power supply 210 to first thermoelectric cooler 202 and second thermoelectric cooler 204, a temperature gradient forms between cool side 216 and hot side 218. A second heat gradient forms between cool side 216 and the plurality of dies 206, which generate heat when operating. This second heat gradient has the effect of removing heat from the stacked cell 3D IC 314. Heat generated in the stacked cell 3D IC 314 flows horizontally to the plurality of ILVs 308 and then vertically through the plurality of ILVs 308 to the cool side 216 of both first thermoelectric cooler 202 and second thermoelectric cooler 204. The heat is then transferred from cool side 216 to hot side 218, which dissipates the heat to the ambient environment.

In some embodiments, hot side 218 includes a series of fins, protrusions, or comb-like structures to increase the surface area of hot side 218, thus increasing the rate of heat transfer from hot side 218 to the surrounding atmosphere. In some embodiments, a fan is employed to provide increased airflow over hot side 218, further improving the rate of convection heat transfer from hot side 218 to the surrounding atmosphere.

FIGS. 4A, 4B, and 4C are plan views of various embodiments of the cool side 216 of a thermoelectric cooler 402 in accordance with some aspects of the present disclosure. These figures illustrate some of the potential configurations of the plurality of conductive pillars 408 connecting to the thermoelectric cooler 402. In some embodiments, conductive pillars 408 include TSVs 208 and microbumps 224. In some embodiments, conductive pillars 408 include ILVs 308 or a combination of ILVs 308 and local vias 326.

FIG. 4A illustrates a first conductive pillar configuration 400 in which conductive pillars 408 are disposed along two opposing sides of thermoelectric cooler 402. FIG. 4B illustrates a second conductive pillar configuration 410 in which conductive pillars 408 are disposed along the entire perimeter thermoelectric cooler 402. Thus second conductive pillar configuration 410 has a greater heat removal capacity than first conductive pillar configuration 400 because it comprises a larger number of conductive pillars 408 and those conductive pillars 408 are disposed over a larger surface area.

FIG. 4C illustrates a third conductive pillar configuration 420 in which conductive pillars 408 are disposed both around the entire perimeter and within the center of thermoelectric cooler 402. In particular, third conductive pillar configuration 420 demonstrates removing heat from a particular area of concern within a 3D IC. The area of concern is illustrated as hot spot 430.

A hot spot 430 is an area of a 3D IC with localized high temperatures. Localized high temperatures are generally caused by components with high power consumption. Localized high temperatures can also form in areas of high power density, such as an area with a high density of conductive pillars 408.

Hot spots 430 are a particular concern because the localized high temperatures affect circuit and component reliability and performance. Failure to address localized high temperatures during 3D IC design can lead to components exceeding their design temperature thresholds. Third conductive pillar configuration 420 addresses this concern by removing heat from the vicinity of hot spot 430 to provide adequate cooling and prevent component failure or degradation.

In some cooled 3D ICs it is not desired to have the thermoelectric cooler 202, 204 operating at all times. Specifically, some 3D ICs do not generate sufficient heat during operation to justify the power consumed by the thermoelectric cooler 202, 204 during continuous operation. Thus, some embodiments provide a temperature monitor 510 and controller 212 to control the operation of a thermoelectric cooler 202, 204.

FIG. 5A is a simplified block diagram of a stacked cell 3D IC 314 with temperature monitor 510 and controller 212 in accordance with some embodiments of the present disclosure. In the illustrated embodiment, temperature monitor 510 is disposed adjacent to hot spot 430. Hot spot 430 and temperature monitor 510 are disposed between first ILV 502 and second ILV 504. First ILV 502 and second ILV 504 are connected to first thermoelectric cooler 202 and second thermoelectric cooler 204 by local vias 326 or microbumps. In some embodiments, first ILV 502 is connected only to one of thermoelectric cooler 202 and second thermoelectric cooler 204. In some embodiments, second ILV 504 is connected only to one of thermoelectric cooler 202 and second thermoelectric cooler 204.

Temperature monitor 510 can be disposed in any location within the stacked cell 3D IC 314. Disposing temperature monitor 510 adjacent to or in the vicinity of hot spot 430 allows for monitoring the area of the stacked cell 3D IC 314 most likely to exceed temperature design thresholds. In some embodiments, temperature monitor 510 is implemented as a thermal detector 700 as described below in relation to FIG. 7.

Temperature monitor 510 is coupled to controller 212. Controller 212 receives electrical power input from power supply 210. Controller 212 controls the flow of electrical power to first thermoelectric cooler 202 and second thermoelectric cooler 204. In some embodiments, controller 212 is implemented as control circuit 800 as described below in relation to FIG. 8.

Figure 5B:
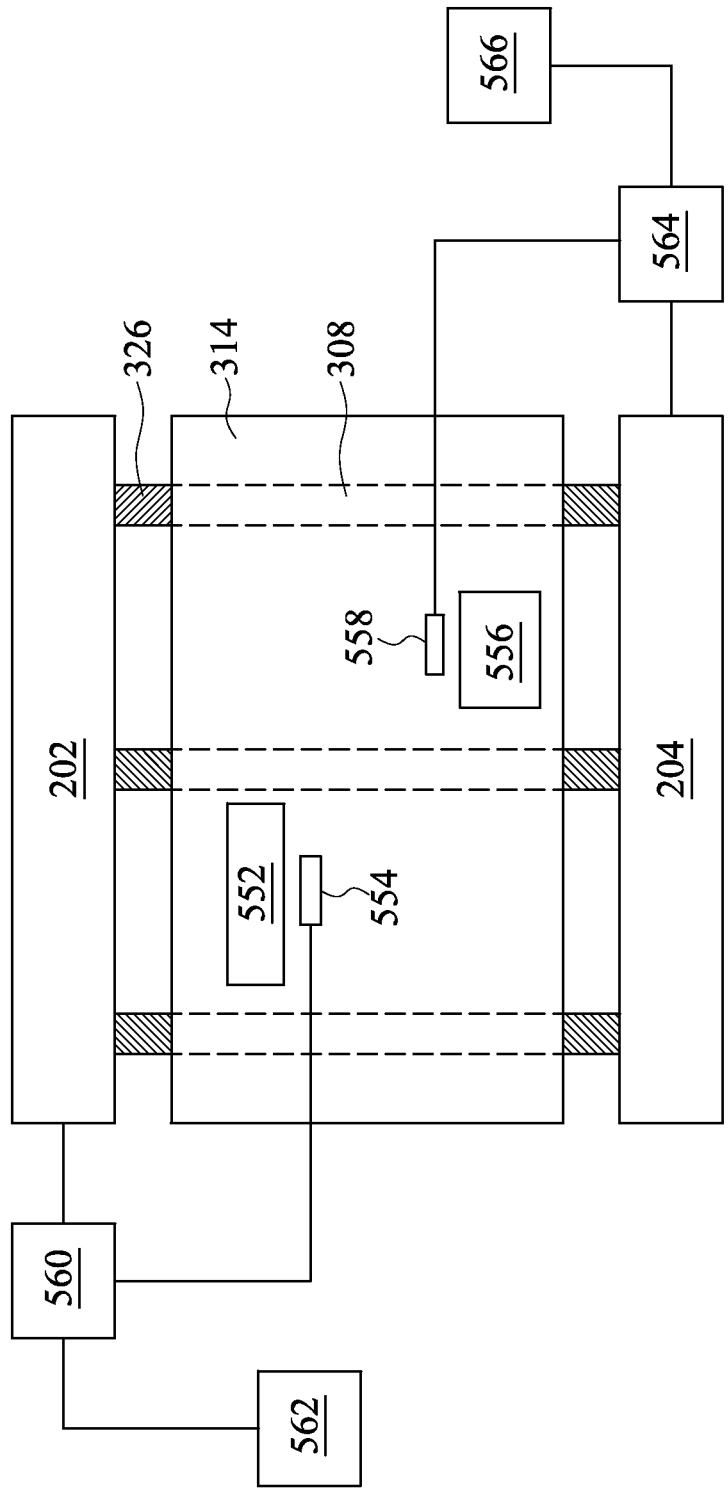
FIG. 5B is a simplified block diagram of a cooled 3D IC with temperature monitors and controllers in accordance with some embodiments of the present disclosure.

FIG. 5B is a simplified block diagram of a stacked cell 3D IC 314 with a pair of temperature monitors 554, 558 and a pair of controllers 560, 564 in accordance with some embodiments of the present disclosure.

In the illustrated embodiment, a first temperature monitor 554 is disposed adjacent to a first hot spot 552. First temperature monitor 554 is coupled to first controller 560. First controller 560 receives electrical power from first power supply 562 and controls the flow of electrical power to first thermoelectric cooler 202 based on input from first temperature monitor 554.

A second temperature monitor 558 is disposed adjacent to a second hot spot 556. Second temperature monitor 558 is coupled to second controller 564. Second controller 564 receives electrical power from second power supply 566 and controls the flow of electrical power to second thermoelectric cooler 204 based on input from second temperature monitor 558.

First temperature monitor 554, first hot spot 552, second temperature monitor 558, and second hot spot 556 are disposed between a plurality of ILVs 308. Each ILV 308 is connected to first thermoelectric cooler 202 and second thermoelectric cooler 204 by a local via 326 or microbump.

In some embodiments, some ILVs 308 are connected only to one of thermoelectric cooler 202 and second thermoelectric cooler 204.

In some embodiments first power supply 562 and second power supply 566 are the same power supply. In some embodiments a single controller 212 receives inputs from a plurality of temperature monitors disposed within stacked cell 3D IC 314 and controls the flow of electrical power to a plurality of thermoelectric coolers.

The temperature monitors and controllers described in relation to FIGS. 5A and 5B can also be used with the 3D IC chip package 214 illustrated in FIG. 2.

Figure 6:
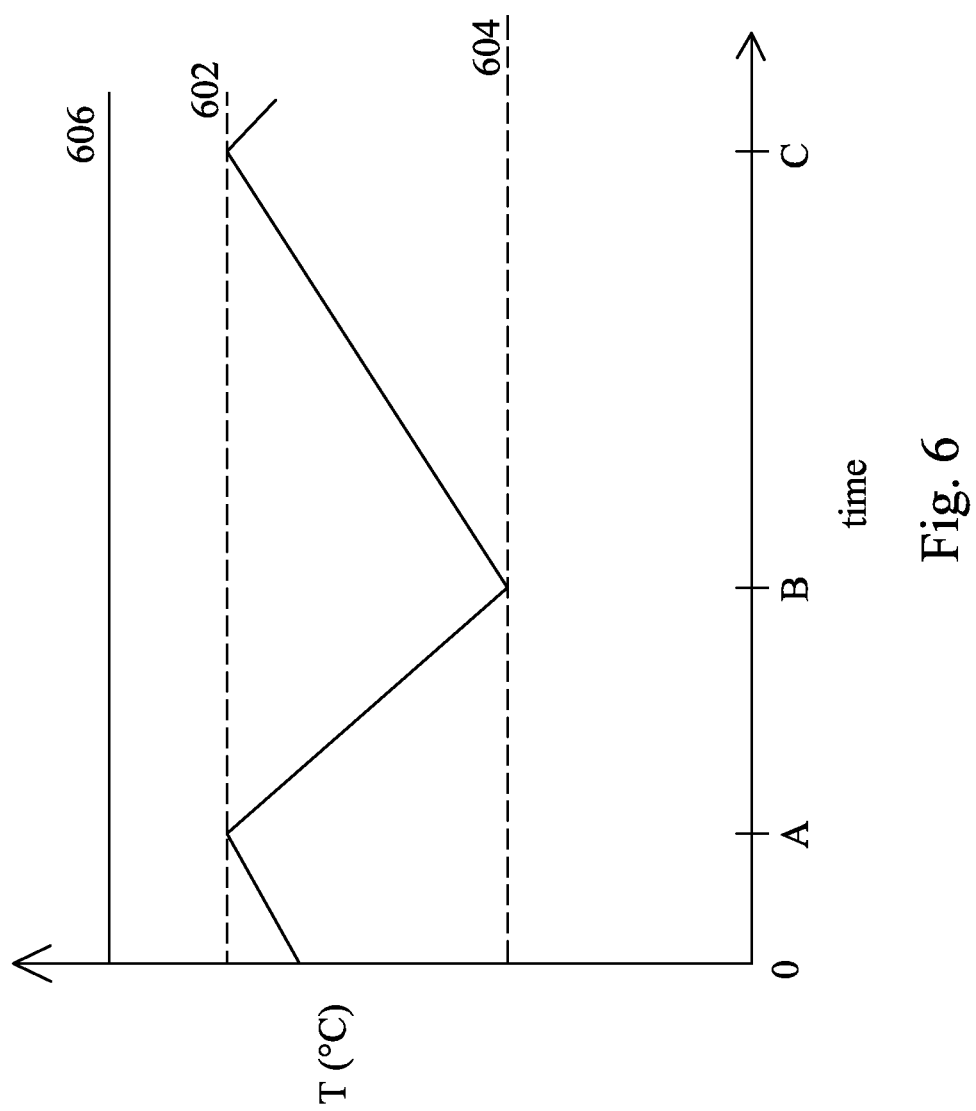
FIG. 6 is a graph of temperature over time illustrating the function of the controller in accordance with some embodiments of the present disclosure.

FIG. 6 is a graph of temperature over time illustrating the function of the controller in accordance with some embodiments of the present disclosure. FIG. 6 illustrates the cycling of electrical power to a thermoelectric cooler based on input from a temperature monitor, such as the controller and temperature monitor configuration illustrated in FIG. 5A.

Controller 212 controls the flow of electrical power to first thermoelectric cooler 202 and second thermoelectric cooler 204. Controller 212 receives electrical power input from power supply 210 and a temperature input from temperature monitor 510.

In some embodiments as illustrated in FIG. 6, controller 212 has a first predetermined setpoint 602 and a second predetermined setpoint 604 such that second predetermined setpoint 604 is less than first predetermined setpoint 602. Both first predetermined setpoint 602 and second predetermined setpoint 604 are less than a design temperature threshold 606. First predetermined setpoint 602 and second predetermined setpoint 604 define a predetermined range of temperatures in which it is desired for a 3D IC to operate.

From time 0 to time A, as indicated in FIG. 6, the thermoelectric coolers 202, 204 are not receiving electrical power from power supply 210 via controller 212 and therefore are not operating. The internal temperature of stacked cell 3D IC 314, as monitored by temperature monitor 510, slowly rises as heat is generated during operation of the stacked cell 3D IC 314.

At time A the internal temperature of stacked cell 3D IC 314, as monitored by temperature monitor 510, reaches first predetermined setpoint 602. This causes controller 212 to supply electrical power to thermoelectric coolers 202, 204.

Between time A and time B, thermoelectric coolers 202, 204 are operating, removing heat from stacked cell 3D IC 314 and the internal temperature monitored by temperature monitor 510 is decreasing.

At time B the internal temperature of stacked cell 3D IC 314, as monitored by temperature monitor 510, reaches second predetermined setpoint 604. This causes controller 212 to stop supplying electrical power to thermoelectric coolers 202, 204.

From time B to time C, thermoelectric coolers 202, 204 are not running. The internal temperature of stacked cell 3D IC 314, as monitored by temperature monitor 510, slowly rises as heat is generated during operation of the stacked cell 3D IC 314.

This process of cycling electrical power to the thermoelectric coolers to keep internal temperatures of stacked cell 3D IC 314 between a first predetermined setpoint 602 and a second predetermined setpoint 604 can be repeated numerous times in the life of a stacked cell 3D IC 314.

Figure 7:
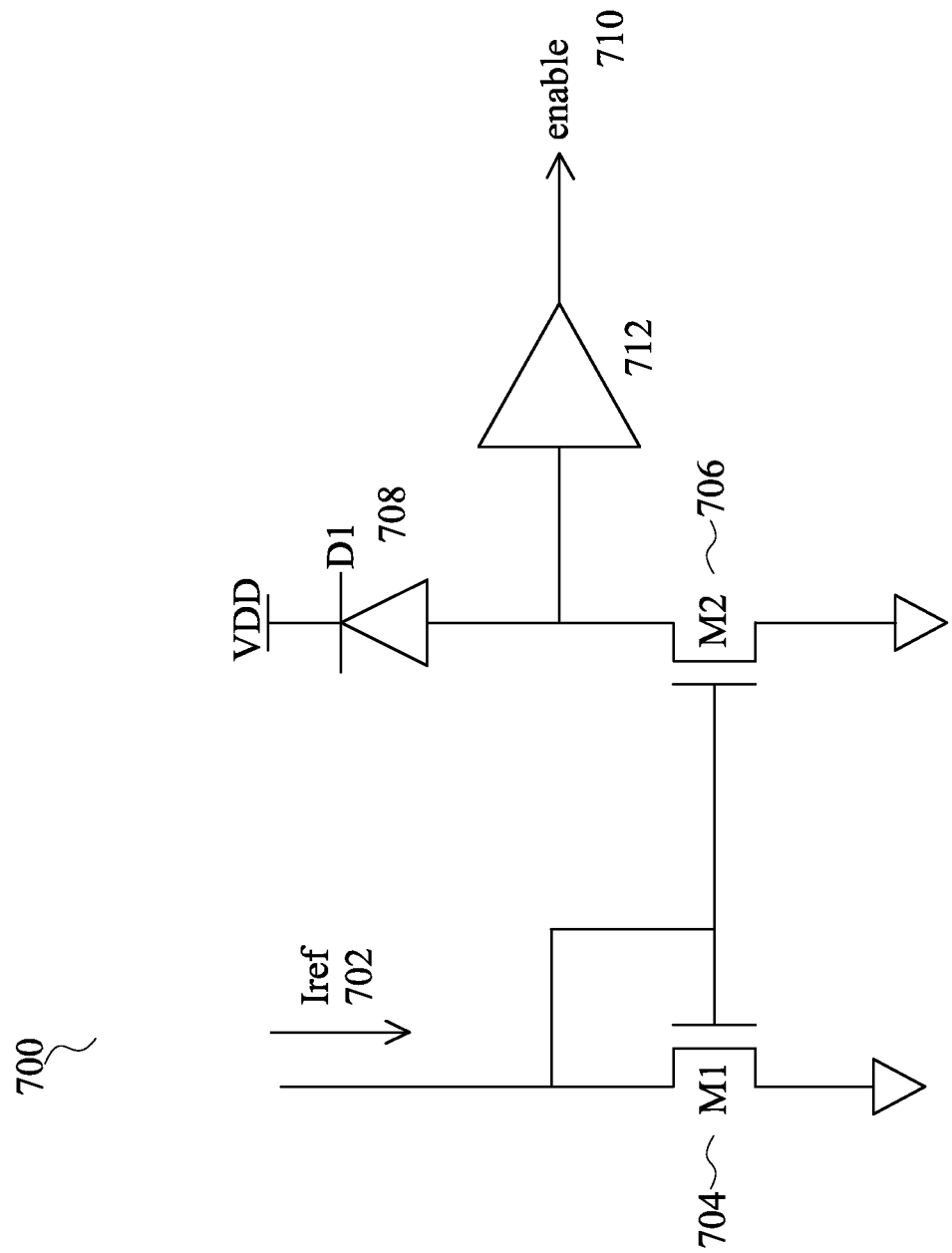
FIG. 7 is a schematic diagram of a thermal detector circuit in accordance with some embodiments of the present disclosure.

In some embodiments, temperature monitor 510 is implemented as thermal detector circuit 700. FIG. 7 is a schematic diagram of a thermal detector circuit 700 in accordance with some embodiments of the present disclosure.

The thermal detector comprises a first N-type metal oxide semiconductor (NMOS) field effect transistor (FET) 704, a second NMOS FET 706, a diode 708, and a buffer 712. First NMOS FET 704 has its drain connected to ground and both its source and gate connected to receive a reference current ($I_{ref}$ 702) which is a temperature compensated current source. Second NMOS FET 706 has its source connected to ground, its gate connected to receive reference current $I_{ref}$ 702, and its drain connected to diode 708 and buffer 712. Although transistors 704 and 706 are described as being metal oxide semiconductor field effect transistors (MOSFETs), one of ordinary skill in the art will understand that other types of transistors can be used.

Diode 708 has its anode connected to the source of second NMOS FET 706 and its cathode connected to a positive power supply node (denoted $V_{DD}$). Buffer 712 receives input from the drain of second NMOS FET 706 and outputs to enable line 710. Enable line 710 sends the output of thermal detector 700 to control circuit 800.

Reference current ($I_{ref}$ 702) is a temperature compensated current source from within the 3D IC. When $I_{ref}$ 702 sensed at the gate of second NMOS FET 706 is greater than the threshold voltage of second NMOS FET 706, then second NMOS FET 706 provides a logic high output signal to buffer 712. When $I_{ref}$ 702 sensed at the gate of second NMOS FET 706 is less than the threshold voltage of second NMOS FET 706, then second NMOS FET 706 provides a logic low output signal to buffer 712. Buffer 712 buffers the signal and provides either a logic high or logic low output signal to enable line 710. First NMOS FET 704 and diode 708 provide protection for power transients.

The threshold voltages for first NMOS FET 704, second NMOS FET 706, and the temperature compensation used for reference current ($I_{ref}$ 702) are selected as appropriate to the temperatures anticipated to be monitored in a 3D IC.

Figure 8:
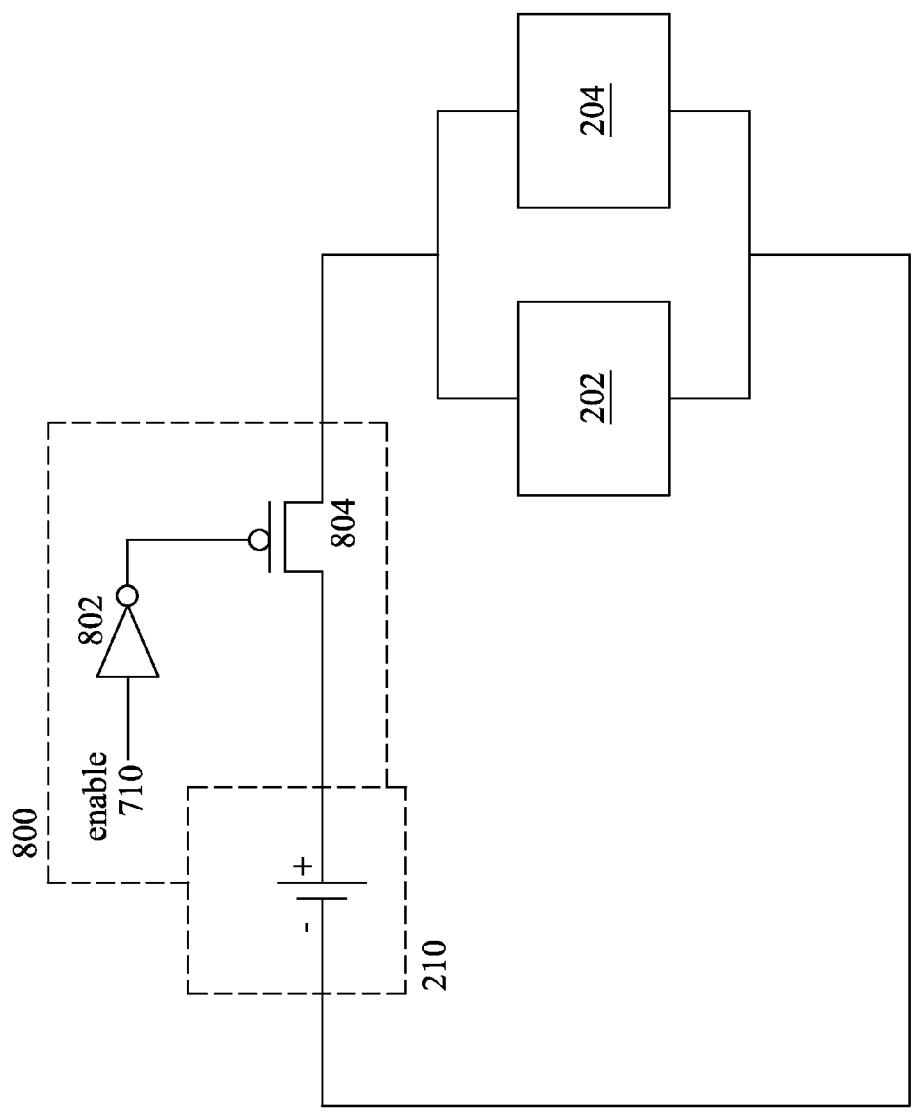
FIG. 8 is a schematic diagram of a control circuit in accordance with some embodiments of the present disclosure.

In some embodiments, a controller 212 is implemented as a control circuit 800. FIG. 8 is a schematic diagram of a control circuit 800 in accordance with some embodiments of the present disclosure.

Control circuit 800 comprises an inverter 802 and a P-type metal oxide semiconductor (PMOS) FET 804. Inverter 802 inverts the voltage level received at its input from enable line 710 and outputs a voltage to the gate of PMOS FET 804. PMOS FET 804 has its drain connected to power supply 210 and its source connected to first thermoelectric cooler 202 and second thermoelectric cooler 204.

When a logic high signal is received on the enable line 710 to inverter 802, it is inverted to a low output which is sent to the gate of PMOS FET 804. When the low output is below the drain voltage by a measure of the voltage threshold of PMOS FET 804, then the source of PMOS FET 804 sends power to first thermoelectric cooler 202 and second thermoelectric cooler 204. Thus first thermoelectric cooler 202 and second thermoelectric cooler 204 are powered (i.e. operating) when thermal detector is sensing a high temperature—or a temperature above a first predetermined setpoint—in the 3D IC.

When a logic low signal is received on the enable line 710 to inverter 802, it is inverted to a high output which is sent to the gate of PMOS FET 804. When the high output is above the voltage threshold of PMOS FET 804 minus the drain voltage, then the source of PMOS FET 804 does not send power to first thermoelectric cooler 202 and second thermoelectric cooler 204. Thus first thermoelectric cooler 202 and second thermoelectric cooler 204 are not powered (i.e. secured) when thermal detector is sensing a low temperature—or a temperature below a second predetermined setpoint—in the 3D IC.

Figure 9:
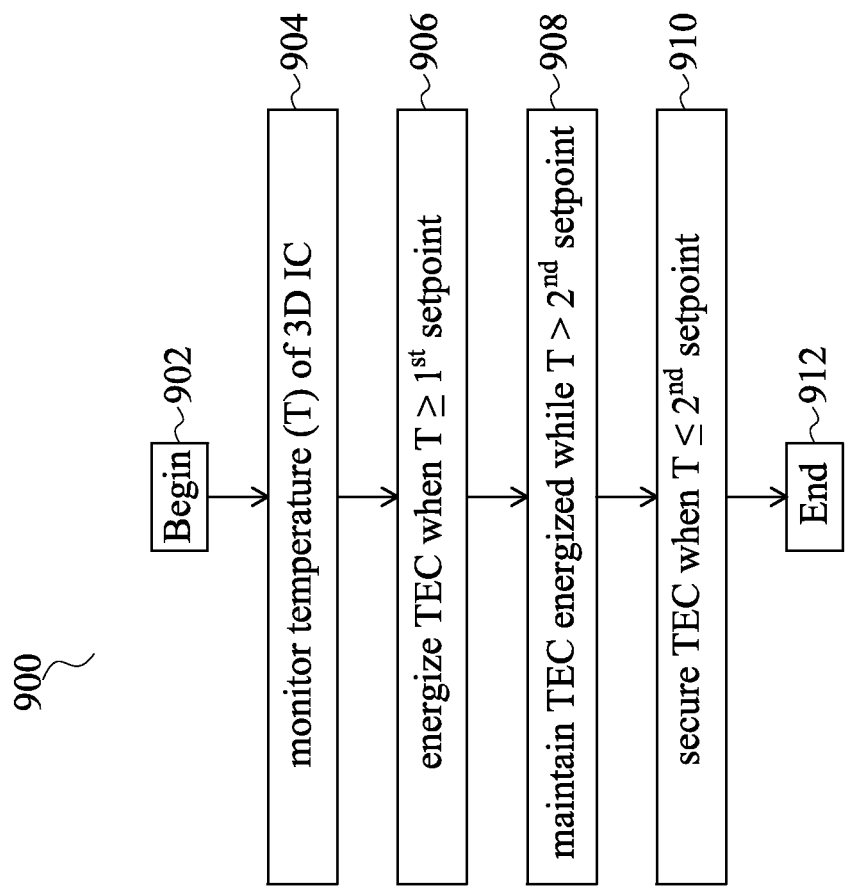
FIG. 9 is a flow diagram of a method in accordance with some embodiments of the present disclosure.

A method 900 of cooling a 3D IC is further provided. FIG. 9 is a flow diagram of a method 900 in accordance with some embodiments of the present disclosure. The process begins at block 902. At block 904 a temperature of a 3D IC is monitored. In some embodiments, the temperature is monitored at an internal location of the 3D IC using a temperature monitor disposed within the 3D IC. In some embodiments, the temperature monitor is implemented as a thermal detector circuit. In some embodiments, the temperature is monitored at predetermined intervals.

At block 906 a thermoelectric cooler is energized when the temperature monitor indicates a temperature greater than or equal to a first setpoint. In some embodiments, the thermoelectric cooler is connected to the 3D IC via a plurality of conductive pillars. In some embodiments, the thermoelectric cooler is energized at the first predetermined interval when the temperature monitor indicates an internal temperature of the 3D IC is greater than or equal to a first setpoint. In some embodiments the first setpoint is set below the design temperature threshold of a limiting component of the 3D IC. In some embodiments the first setpoint is predetermined; in other embodiments, the first setpoint is determined dynamically.

At block 908 the thermoelectric cooler is maintained energized while the temperature is greater than a second setpoint. In some embodiments, the second setpoint is less than the first setpoint. In some embodiments the second setpoint is predetermined; in other embodiments, the second setpoint is determined dynamically.

At block 910 the thermoelectric cooler is secured (i.e. de-energized) when the temperature is less than or equal to the second setpoint. In some embodiments, the thermoelectric cooler is secured at the first predetermined interval when the temperature monitor indicates an internal temperature of the 3D IC less than or equal to the second setpoint. The process ends at block 912.

The present disclosure of a thermoelectric cooler in combination with a 3D IC has several advantages. A thermoelectric cooler allows temperature to be controlled within a fraction of a degree. A thermoelectric cooler also has a relatively long lifetime, providing effective cooling for the duration of a 3D ICs useful life.

In some embodiments, a system comprises a three dimensional integrated circuit (3D IC); a first thermoelectric cooler, connected to the 3D IC by a plurality of conductive pillars; a controller which controls the first thermoelectric cooler; and a temperature monitor positioned to sense a temperature of the 3D IC, the temperature monitor coupled to the controller. In some embodiments, the 3D IC is a stacked chip package containing a plurality of dies. In some embodiments, the 3D IC is a stacked cell 3D IC. In some embodiments, the plurality of conductive pillars are disposed about a perimeter of the stacked cell 3D IC. In some embodiments, the plurality of conductive pillars comprise a first set of conductive pillars disposed about the perimeter of the 3D IC and a second set of conductive pillars disposed about a hot spot inside the 3D IC. In some embodiments, the system further comprises a second thermoelectric cooler connected to the 3D IC by a plurality of conductive pillars. In some embodiments, the second thermoelectric cooler is disposed on a side of the 3D IC opposite the first thermoelectric cooler. In some embodiments, the temperature monitor is disposed in the 3D IC and wherein the temperature monitor is configured to detect an internal temperature of the 3D IC. In some embodiments, the controller cycles electrical power to the first thermoelectric cooler to maintain an internal temperature of the 3D IC, as measured by the temperature monitor, within a predetermined range defined by a first predetermined setpoint and a second predetermined setpoint. In some embodiments, the temperature monitor monitors the internal temperature of the 3D IC at a predetermined interval. In some embodiments, the first thermoelectric cooler comprises a plurality of n-type semiconductor pellets and a plurality of p-type semiconductor pellets, disposed between a first conducting plate and a second conducting plate and electrically connected in series, such that a temperature gradient forms across the first conducting plate and the second conducting plate when voltage is applied across the plurality of n-type semiconductor pellets and the plurality of p-type semiconductor pellets.

In some embodiments, a system comprises a stacked cell 3D IC; a first thermoelectric cooler, the thermoelectric cooler comprising a plurality of n-type semiconductor pellets and a plurality of p-type semiconductor pellets, disposed between a first conducting plate and a second conducting plate and electrically connected in series, the first thermoelectric cooler configured to form a temperature gradient across the first conducting plate and the second conducting plate when voltage is applied across the plurality of n-type semiconductor pellets and the plurality of p-type semiconductor pellets, the first thermoelectric cooler connected to the stacked cell 3D IC by a plurality of conductive pillars; a controller which controls a supply of power to the thermoelectric cooler; and a temperature monitor, disposed in the stacked cell 3D IC, wherein the temperature monitor is configured to detect an internal temperature of the stacked cell 3D IC and is coupled to the controller. In some embodiments, the system further comprises a second thermoelectric cooler connected to the stacked cell 3D IC by the plurality of conductive pillars. In some embodiments, the controller provides electrical power to the thermoelectric cooler to maintain an internal temperature, as measured by the temperature monitor, of the stacked cell 3D IC within a predetermined range.

In some embodiments, a method comprises monitoring a temperature of a three dimensional integrated circuit at a predetermined interval; and energizing a thermoelectric cooler, the thermoelectric cooler connected to the three dimensional integrated circuit via a plurality of conductive pillars, when the monitored temperature of the three dimensional integrated circuit is greater than or equal to a first predetermined setpoint. In some embodiments, monitoring includes using a temperature monitor disposed within the three dimensional integrated circuit. In some embodiments, the monitored temperature is an internal temperature of the three dimensional integrated circuit. In some embodiments, the first predetermined setpoint is set to prevent a component of the three dimensional integrated circuit from exceeding a design temperature threshold. In some embodiments, the thermoelectric cooler is energized by a power supply under control of a controller which receives a signal from the temperature monitor. In some embodiments, the method further comprises maintaining the thermoelectric cooler energized while the temperature monitor indicates the internal temperature of the three dimensional integrated circuit is greater than a second predetermined setpoint, wherein second predetermined setpoint is less than the first predetermined setpoint; and stopping the thermoelectric cooler when the temperature monitor indicates an internal temperature of the three dimensional integrated circuit is less than or equal to the second predetermined setpoint.

Although examples are illustrated and described herein, embodiments are nevertheless not limited to the details shown, since various modifications and structural changes can be made therein by those of ordinary skill within the scope and range of equivalents of the claims.

What is claimed is:

1. A system, comprising:
   a three dimensional integrated circuit (3D IC);
   a first thermoelectric cooler comprising a first plurality of semiconductor pellets disposed between a first cooling ceramic plate and a first warming ceramic plate and electrically connected such that the application of voltage across the first plurality of semiconductor pellets results in cooling the first cooling ceramic plate and warming the first warming ceramic plate, said first thermoelectric cooler coupled at the first cooling plate to a first side of the 3D IC by a first plurality of conductive pillars;
   a second thermoelectric cooler comprising a second plurality of semiconductor pellets disposed between a second cooling ceramic plate and a second warming ceramic plate and electrically connected such that the application of voltage across the second plurality of semiconductor pellets results in cooling the second cooling ceramic plate and warming the second warming ceramic plate, said second thermoelectric cooler coupled at the second cooling plate to a second side of the 3D IC by a second plurality of conductive pillars, wherein said second side is opposite said first side;
   a controller which controls the first thermoelectric cooler and the second thermoelectric cooler; and
   a temperature monitor positioned to sense a temperature of the 3D IC, the temperature monitor coupled to the controller.

2. The system of claim 1, wherein the 3D IC is a stacked cell 3D IC.

3. The system of claim 2, wherein the first plurality of conductive pillars are disposed about a perimeter of the stacked cell 3D IC.

4. The system of claim 2, wherein the first plurality of conductive pillars comprise a first set of conductive pillars disposed about a perimeter of the 3D IC and a second set of conductive pillars disposed about a hot spot inside the 3D IC.

5. The system of claim 1, wherein the temperature monitor is disposed in the 3D IC and is configured to detect an internal temperature of the 3D IC.

6. The system of claim 5, wherein the controller is adapted to cycle electrical power to the first thermoelectric cooler and the second thermoelectric cooler to maintain an internal temperature of the 3D IC, as measured by the temperature monitor, within a predetermined range defined by a first predetermined setpoint and a second predetermined setpoint.

7. The system of claim 6, wherein the temperature monitor is adapted to monitor the internal temperature of the 3D IC at a predetermined interval.

8. The system of claim 1 wherein the first plurality of semiconductor pellets comprises at least one n-type semiconductor pellet and at least one p-type semiconductor pellet.

9. The system of claim 1 wherein at least one of the first cooling ceramic plate and the first warming ceramic plate comprises a plurality of fins extending from the plate and adapted to increase the rate of heat transfer from the plate.

10. The system of claim 9 further comprising a fan configured to move air across at least one of the first cooling ceramic plate and the first warming ceramic plate to increase the rate of heat transfer from the plate.

11. The system of claim 1 wherein the first thermoelectric cooler is operated by a first current path and the second thermoelectric cooler is operated by a second current path, and wherein the first current path is electrically isolated from the second current path.

12. A system of cooling a three dimensional integrated circuit, comprising:
    a stacked cell 3D IC;
    a first thermoelectric cooler disposed on a first side of the 3D IC and a second thermoelectric cooler disposed on a second side of the 3D IC opposite the first side, each of the first thermoelectric cooler and the second thermoelectric cooler comprising a respective plurality of n-type semiconductor pellets and a respective plurality of p-type semiconductor pellets disposed between a respective first conducting plate and a respective second conducting plate, each of the first thermoelectric cooler and the second thermoelectric cooler configured to form a respective temperature gradient across the first conducting plate and the second conducting plate when voltage is applied across the respective plurality of n-type semiconductor pellets and the respective plurality of p-type semiconductor pellets, wherein each of the first thermoelectric cooler and the second thermoelectric cooler are thermally coupled at one of a respective first conducting plate or second conducting plate to the stacked cell 3D IC by a respective plurality of conductive pillars, and wherein each of the first thermoelectric cooler and the second thermoelectric cooler are electrically isolated from the stacked cell 3D IC by one of a respective first conducting plate or second conducting plate;
    a controller which controls a supply of power to the first and second thermoelectric coolers; and
    a temperature monitor, disposed in the stacked cell 3D IC, wherein the temperature monitor is configured to detect an internal temperature of the stacked cell 3D IC and is coupled to the controller.

13. The system of claim 12, wherein the controller is adapted to provide electrical power to the first thermoelectric cooler to maintain an internal temperature, as measured by the temperature monitor, of the stacked cell 3D IC within a predetermined range.

14. The system of claim 12 wherein the one of the first cooling ceramic plate and the first warming ceramic plate in each of the first thermoelectric cooler and the second thermoelectric cooler with the lower temperature is disposed facing the stacked cell 3D IC.

15. A system of cooling a stacked cell three dimensional integrated circuit (3D IC) comprising:
    a stacked cell 3D IC comprising a plurality of integrated circuit substrates, each substrate having at least one component attached thereto, wherein said plurality of integrated circuit substrates are stacked and connected by at least one inter-level via;
    a first thermoelectric cooler and a second thermoelectric cooler coupled to the stacked cell 3D IC by a local via coupled to the at least one inter-level via, said first and second thermoelectric coolers disposed on a first and second side, respectively, of the stacked cell 3D IC and adapted to provide cooling to the stacked cell 3D IC, wherein each of the first and second thermoelectric coolers comprise a plurality of thermoelectric pellets coupled between a pair of conductive plates and adapted to create a thermal gradient between the conductive plates; and a temperature monitor disposed within said stacked cell 3D IC and coupled to said first thermoelectric cooler.

16. The system of claim 15 wherein said plurality of integrated circuit substrates are stacked along a first axis with said first thermoelectric cooler disposed at one end of the stacked substrates and said second thermoelectric cooler disposed at another end of the stacked substrates opposite said first thermoelectric cooler.

17. The system of claim 16 wherein said first thermoelectric cooler is adapted to maintain the stacked cell 3D IC temperature within a predetermined temperature range as measured by the temperature monitor.

18. The system of claim 15 wherein the at least one inter-level via comprises a plurality of inter-level vias disposed around the perimeter of said stacked cell 3D IC.

19. The system of claim 15 wherein the at least one inter-level via comprises a plurality of inter-level vias disposed around an area of localize high temperatures of said stacked cell 3D IC.

20. The system of claim 19 wherein said temperature monitor is disposed adjacent to said area of localize high temperatures.

21. The system of claim 15 wherein said temperature monitor is a temperature detector circuit comprising at least one N-type metal oxide semiconductor field effect transistor.

* * * * *